US008446286B2

(12) United States Patent
Stell

(10) Patent No.: US 8,446,286 B2
(45) Date of Patent: May 21, 2013

(54) METHOD AND SYSTEM FOR A DIGITAL VOLTAGE DETECTOR WITH DIGITAL VOLTAGE DISPLAY FOR ARMAMENT CIRCUIT TESTING

(75) Inventor: Andrew W. Stell, Aledo, TX (US)

(73) Assignee: Williams-Pyro, Inc., Fort Worth, TX (US)

( * ) Notice: Subject to any disclaimer, the term of this patent is extended or adjusted under 35 U.S.C. 154(b) by 0 days.

(21) Appl. No.: 13/479,243

(22) Filed: May 23, 2012

(65) Prior Publication Data

US 2012/0242323 A1    Sep. 27, 2012

Related U.S. Application Data

(62) Division of application No. 12/136,656, filed on Jun. 10, 2008, now Pat. No. 8,248,261.

(51) Int. Cl.
*G08B 21/00* (2006.01)
(52) U.S. Cl.
USPC ............................ 340/662; 340/660; 324/115

(58) Field of Classification Search
USPC ................ 340/660–665; 324/107–115, 76.11
See application file for complete search history.

(56) References Cited

U.S. PATENT DOCUMENTS 6,147,483 A    11/2000    Havel

*Primary Examiner* — Jeffery Hofsass
(74) *Attorney, Agent, or Firm* — Morani Patent Law, PC

(57) ABSTRACT

A digital voltage detector system that is compatible with existing Armament Circuits Preload Test Sets is described. Adjustment of under and over voltage trip points is accommodated in accordance with conventional means. The digital voltage detector is compatible with all conventional Voltage Detector interface cables and adapters. Unlike the conventional voltage detector of existing Armament Circuits Preload Test Sets, over-voltage trips do not blow a fuse, eliminating the need to have replacement fuses or redundant conventional voltage detectors in an Armament Circuits Preload Test Set. Additionally, the digital voltage detector provides a digital voltage readout allowing the user to view the input voltage during a Presence of Voltage test. The digital voltage detector system facilitates timely and efficient execution of the Armament Circuits Preload Test series.

7 Claims, 9 Drawing Sheets

CONVENTIONAL VOLTAGE DETECTOR WITH INTERNAL RESISTOR CIRCUIT

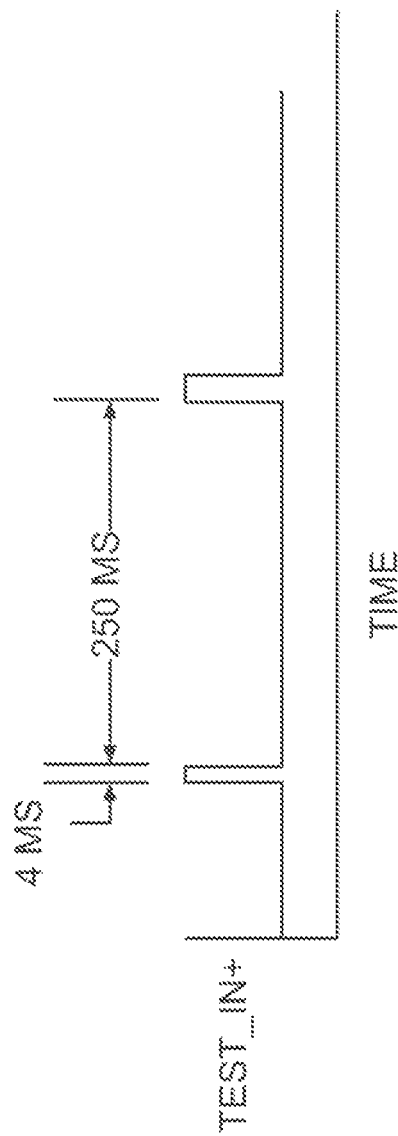

METHOD AND SYSTEM FOR A DIGITAL VOLTAGE DETECTOR WITH DIGITAL VOLTAGE DISPLAY FOR ARMAMENT CIRCUIT TESTING

CROSS REFERENCE TO RELATED APPLICATIONS

This application is a divisional application of U.S. patent application Ser. No. 12/136,656 filed on Jun. 10, 2008, the contents of which are hereby incorporated by reference in its entirety, and to which priority is claimed herein.

BACKGROUND OF THE INVENTION

The present invention relates generally to voltage detectors and more particularly to a voltage detector suitable for use in an Armament Circuits Preload Test Set.

Armament Circuits Preload Test Sets, are used, for example, with air to air missiles, launchers, gravity and guided bombs, multi-ejector racks, and other munitions release systems on combat aircraft. Aircraft on which Armament Circuits Preload Test Sets are used include the F-15 fighter, models A, B, C, D, and E. Armament Circuits Preload Test Sets comprise a voltage detector and interface adapters. The interface adapters provide electrical connection between the voltage detector and various connector types located on the aircraft. The conventional voltage detector performs at least four key test functions when used in an Armament Circuits Preload Test series. The voltage detector assesses Presence of Voltage, continuity in an Electroexplosive Device (EED), and Stray Voltage. The voltage detector also performs an Adapter Test.

An EED conventionally consists of a conductor and a primary combustible material. A variety of propulsion systems and ordnance use an electrical signal to initiate combustion. This signal can be a dc current. Ohmic heating due to dc current flowing in the conductor can raise conductor temperature rapidly. Once a minimum ignition temperature of the primary combustible material is reached, the primary material ignites, which in turn initiates combustion of a secondary material. Part of the Armament Circuits Preload Tests may include a continuity check in an FED. The same conventional voltage detector performs an ohmic Adapter Test and two voltage tests.

The Stray Voltage Test determines whether a circuit that is in an unenergized state is actually free of any voltage that could cause a malfunction in the tested circuit. For example, an FED must normally be tested to ensure that the circuit is free of any stray voltages that could cause an improper triggering of the primary combustible material.

For the conventional voltage detector, an input voltage greater than 0.120 VDC or less than −0.120 VDC causes the voltage detector to turn on the indicator light. The conventional voltage detector comprises the attachment of a 3 ohm load resistance to the measurement circuit for the Stray Voltage Test.

The Presence of Voltage test determines whether an input voltage between 22.0 VDC and 47.0 VDC is present. In the conventional voltage detector, if an input voltage of less than 22.0 VDC is detected, then a test light turns off. Alternatively, however, if the measured input voltage is greater than 47.0 VDC, then a protection circuitry within the conventional voltage detector trips a protection fuse. Before the conventional voltage detector can make subsequent measurements, the fuse must be replaced. And the fuse is not readily accessible, requiring the removal of screws for removal and replacement. Therefore, a technician using the conventional voltage detector would need to have spare fuses at hand and deal with the additional duties of repairing the voltage detector before proceeding with an Armament Circuits Preload Test. Another alternative is to have multiple voltage detectors in each Armament Circuits Preload Test Set.

The conventional voltage detector can also trip the indicator light for a voltage level less than 22.0 VDC and can also invoke the protection circuit for voltages greater than 47.0 VDC. That is, adjustments can be made for measured-input voltage as low as 3.5 VDC to turn off the indicator light. Likewise, an over-voltage as high as 300 VDC can be measured before blowing the protective fuse.

External resistors are used to adjust the level for which the indicator light will turn off or for which the fuse will blow, under voltage and over voltage, respectively. The conventional analog voltage detector 100 and internal resistors circuit 110 is shown in FIG. 1a. The over voltage protection circuit of the conventional voltage detector is not shown.

External resistors are used to vary the input voltage level which trips under voltage or over voltage. For an under voltage trip point greater than 22.0 VDC, an external resistor 126 is connected in series with TEST_IN+ 120 to create a voltage divider between the external resistor and the internal 300 ohm load 112, as shown in FIG. 1b. Connection for TEST_IN+ measurement is moved to 121, in this configuration.

For an under voltage trip point of 3.5 VDC, the TRIP_ADJ pin 130 is connected to TEST_IN+ 120 via connector 122, as shown in FIG. 1c. This configuration raises the input voltage at sense input 142. For under voltage trips between 3.5 and 22 VDC, the TRIP_ADJ pin 130 is connected via connector 122 to TEST_IN+ 120 and an external resistor 126 is connected in series with TEST_IN+, moving the TEST_IN+ measuring point to position 121, as shown in FIG. 1d. Adjustments to raise the over voltage trip point above 47.0 volts before triggering the over protection circuit are not shown.

It would be desirable to have a voltage detector which is compatible with the Armament Circuits Preload Test Sets, which does not require fuse replacement upon sensing of over-voltage.

SUMMARY OF THE INVENTION

The present invention addresses the issues presented above by providing a digital voltage detector system and method that are compatible with existing Armament Circuits Preload Test Sets and that provide an accurate digital voltage display. A digital voltage detector system and method, in accordance with the present invention can perform the four respective conventional Armament Circuits Preload Tests of Presence of Voltage. Continuity in an EED, Stray Voltage, and Ohmic Adapter Test.

Another aspect of the present invention is to provide adjustment for the trip point for the Presence of Voltage test using external resistors to lower the trip voltage.

Another aspect of the present invention is to provide adjustment for the trip point for the Presence of Voltage test using external resistors to raise the Presence of Voltage trip voltage.

Another aspect of the present invention is a Digital Voltage Detector which provides a digital readout allowing the user to view the input voltage during a Presence of Voltage test.

Another aspect of the present invention is to provide a fail indicator light in addition to a pass indicator light.

Another aspect of the present invention is to allow accurate measurement of high and low input voltages with a Digital Voltage Detector.

Another aspect of the present invention is to provide a Digital Voltage Detector which is compatible with all conventional Voltage Detector interface cables and adapters.

Another aspect of the present invention is to provide the technician user with input voltage measurement digital display, facilitating problem identification and troubleshooting.

Yet another aspect of the present invention is to enable reduced man-hours for completion of the Armament Circuits Preload Test series.

Yet another aspect of the present invention is to enable more timely turn around of aircraft due at least in part to efficient execution of the Armament Circuits Preload Test series.

Yet another aspect of the present invention is to reduce equipment redundancy in the conventional Armament Circuits Preload Test set.

Yet another aspect of the present invention is to reduce the need for disposable fuses in an Armament Circuits Preload Test set.

Those skilled in the art will further appreciate the above-noted features and advantages of the invention together with other important aspects thereof upon reading the detailed description that follows in conjunction with the drawings.

BRIEF DESCRIPTION OF THE FIGURES

For more complete understanding of the features and advantages of the present invention, reference is now made to the detailed description of the invention along with the accompanying figures, wherein:

FIG. 4 illustrates a timing diagram in accordance with an exemplary embodiment of the present invention.

DETAILED DESCRIPTION OF THE INVENTION

The invention, as defined by the claims, may be better understood by reference to the following detailed description. The description is meant to be read with reference to the figures contained herein. This detailed description relates to examples of the claimed subject matter for illustrative purposes, and is in no way meant to limit the scope of the invention. The specific aspects and embodiments discussed herein are merely illustrative of ways to make and use the invention, and do not limit the scope of the invention.

Figure 2:
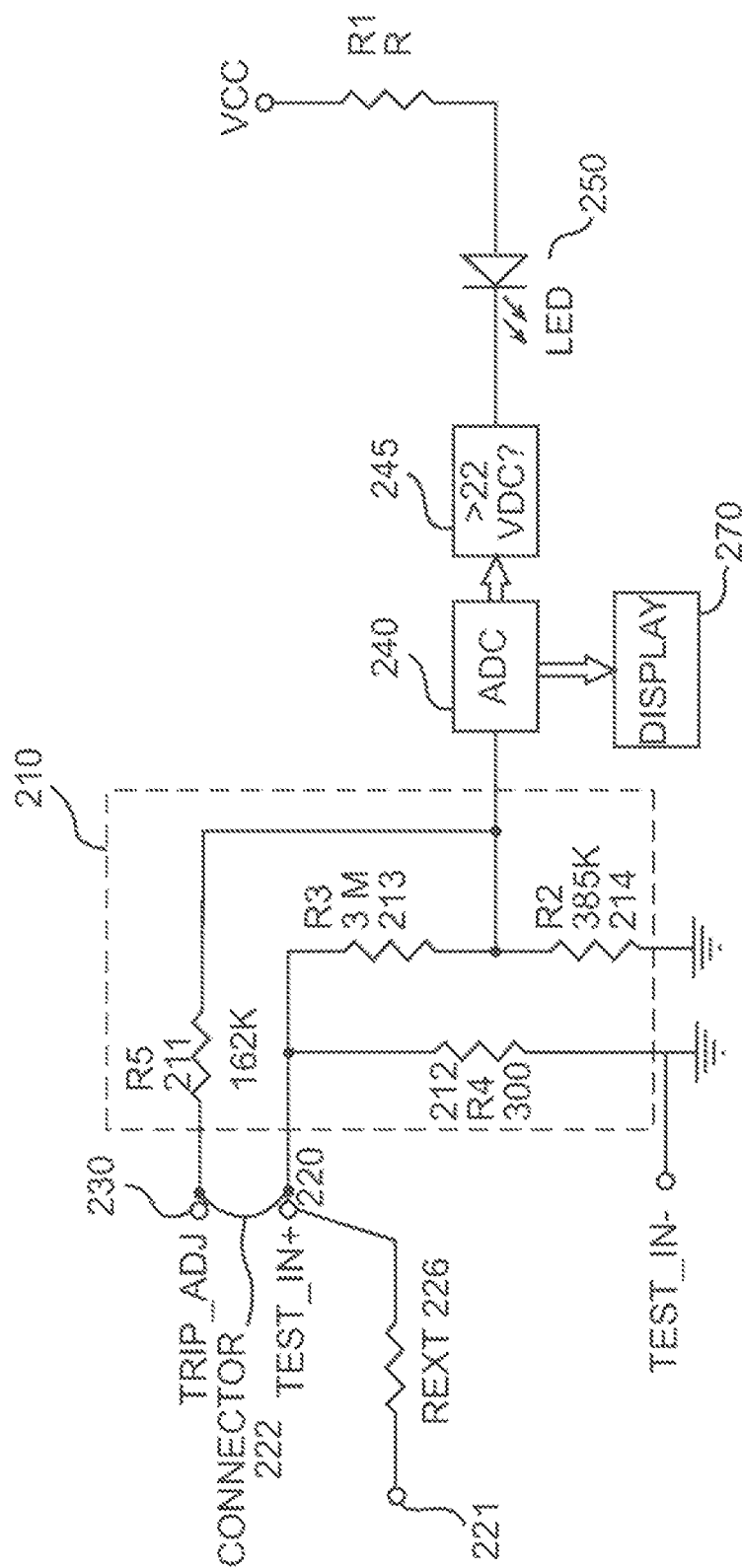
FIG. 2 shows a digital voltage detector comprising an analog-to-digital converter and a microcontroller, replacing the analog comparator of the conventional voltage detector.

While an analog-to-digital converter and a microcontroller can be substituted for the comparator 140 of the conventional voltage detector, 100, an accurate digital voltage reading is not displayed for the user. FIG. 2 shows a digital voltage detector 200 comprising an analog-to-digital converter 240 and a microcontroller 245, replacing the analog comparator 140 of the conventional voltage detector 100. As in the conventional voltage detector, the digital voltage detector 200 uses the internal resistor circuit 110. The Digital Voltage Detector 200 includes a digital display readout 270 in addition to PASS 250 and FAIL 255 lights. A voltage between 22.0 and 47.0 VDC causes the Digital Voltage Detector 200 to turn on the green PASS light 250. A voltage greater than 47.0 VDC causes the Digital Voltage Detector 200 to turn on the red FAIL light 255. A voltage less than 22.0 VDC causes the Digital Voltage Detector 200 to turn both the PASS and FAIL lights 250, 255 off.

And, as in the conventional voltage detector 100, the trip point for the Presence of Voltage test can be adjusted using respective external resistors in the presence or absence of a connector between the TRIP_ADJ pin and TEST_IN+ as described in relation to FIGS. 1a-d. These external resistor and connector configurations yield accurate pass and fail indicator light results. The pass indicator light 250 turns on for a TEST_IN+ that is within the desired voltage range, the fail indicator light 255, turns on for a TEST_IN+ that is above the desired voltage range, and both lights turn off for a TEST_IN+ voltage which is below the range, under voltage. However, when an external resistor 226 is used, as the conventional user is accustomed, the display voltage 270 in the digital voltage detector 200 is erroneous. The erroneous digital display is summarized in TABLE 1 with respect to values of the external resistor 226 value in conjunction with the presence or absence of connector 222 between TRIP_ADJ pin 230 to TEST_IN+ 220, as shown in FIG. 2.

Referring to TABLE 1 and FIG. 2, the Display Reading 270 is off of the true TEST_IN+ 221, input voltage, by the Error, in VDC. Use of an external resistor 226 and a connector 222, or the use of the connector 222 alone, causes positive errors when displaying the input, TEST_IN+ voltage. As in the conventional voltage detector, for an under voltage trip point greater than 22.0 VDC, an external resistor 226 in the absence of connector 222 is used. In the specific example of 381 ohm external resistor added in series with TEST_IN+ on the Digital Voltage Detector 200, the input under voltage trip point would change from 22.0 VDC to 50.0 VDC. An applied voltage, Presence of Voltage of 50 VDC will cause the Digital Voltage Detector to turn on the PASS light 250 correctly; however, the display 270 will show 22.0 VDC rather than the actual 50.0 VDC present at TEST_IN+ 121, Presence of Voltage.

TABLE 1

| TEST_IN Input Range | External Resistor | TRIP_ADJ connected? | Display Reading | Error |
| --- | --- | --- | --- | --- |
| 3.5 VDC | s.c. | Yes | 22.0 VDC | +18.5 VDC |
| 5.0 VDC | 128 ohms | Yes | 22.0 VDC | +17.0 VDC |
| 10.0 VDC | 557 ohms | Yes | 22.0 VDC | +12.0 VDC |
| 15.0 VDC | 986 ohms | Yes | 22.0 VDC | +7.0 VDC |
| 22.0 VDC | s.c. | No | 22.0 VDC | 0 VDC |
| 25.0 VDC | 41 ohms | No | 22.0 VDC | −3.0 VDC |
| 35.0 VDC | 177 ohms | No | 22.0 VDC | −10.0 VDC |
| 50.0 VDC | 381 ohms | No | 22.0 VDC | −28.0 VDC |
| 100 VDC | 1063 ohms | No | 22.0 VDC | −78.0 VDC |
| 150 VDC | 1745 ohms | No | 22.0 VDC | −128 VDC |
| 200 VDC | 2427 ohms | No | 22.0 VDC | −178 VDC |

Similarly, in the absence of connector 222, addition of an external resistor 226, effectively lowers the under voltage trip voltage, however, the measured and displayed voltage 270 is constant at 22.0 VDC, proportionately less than the actual Presence of Voltage, TRIP_IN+. The pass and fail tights still read correctly, however, the replacement of the voltage comparator 140 with the analog-to-digital converter 240 in combination with the conventional input resistor circuit, voltage divider, yields 22.0 VDC at the display rather than the actual 3.5 VDC at TEST_IN+ 221.

Just substituting an ADC and microcontroller for the comparator is insufficient as the conventional input voltage divider will consistently yield a 22 VDC display as measure of TEST_IN+ regardless of the actual TEST_IN+ range. This problem is solved and an accurate voltage measurement display for use by the technician is obtained in accordance with the present invention as described below.

Figure 1A:
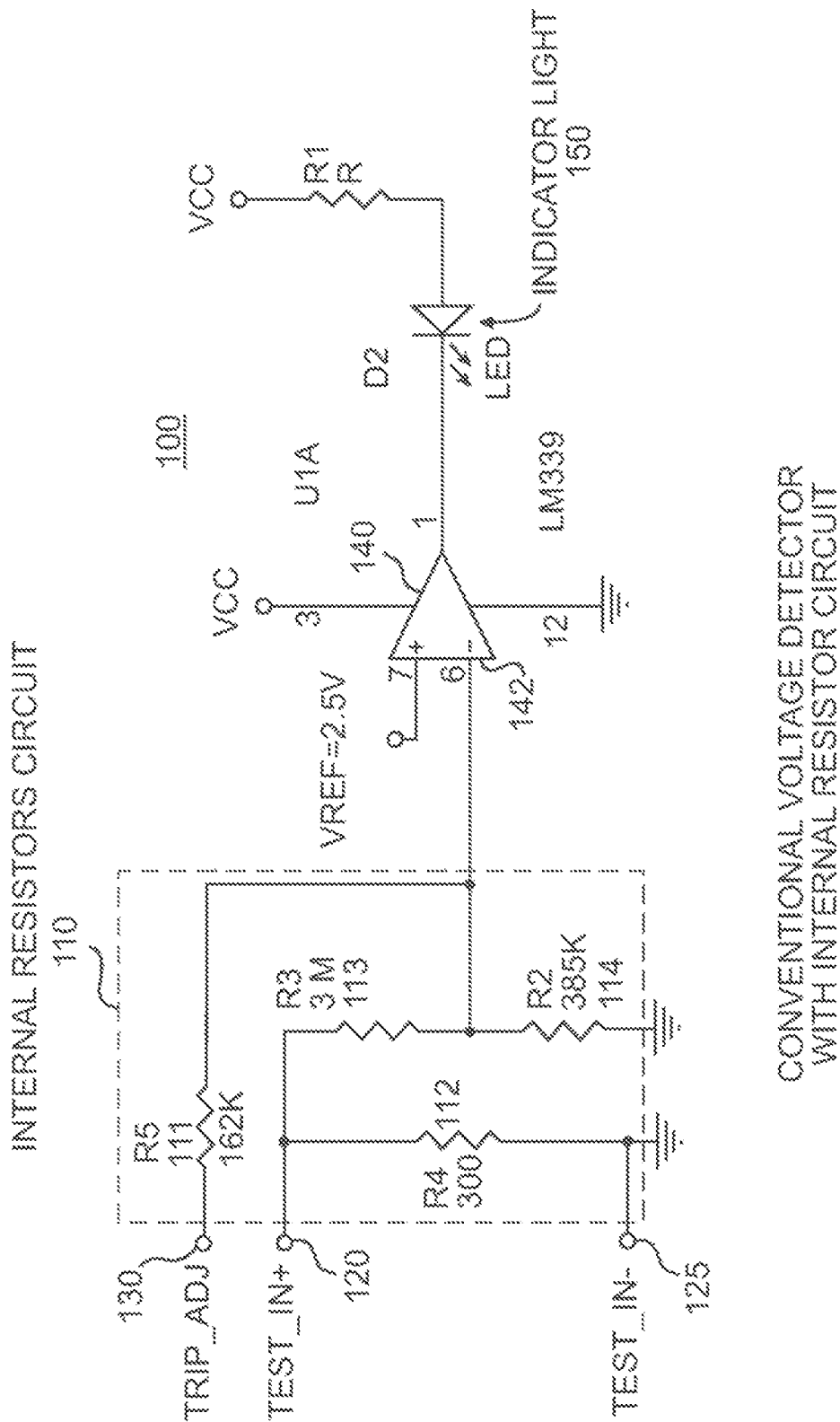
FIGS. 1a-1d show a schematic representation of a conventional voltage detector for an Armament Circuits Preload Test Sets with external adjustments to alter a trip point voltage.
Figure 1B:
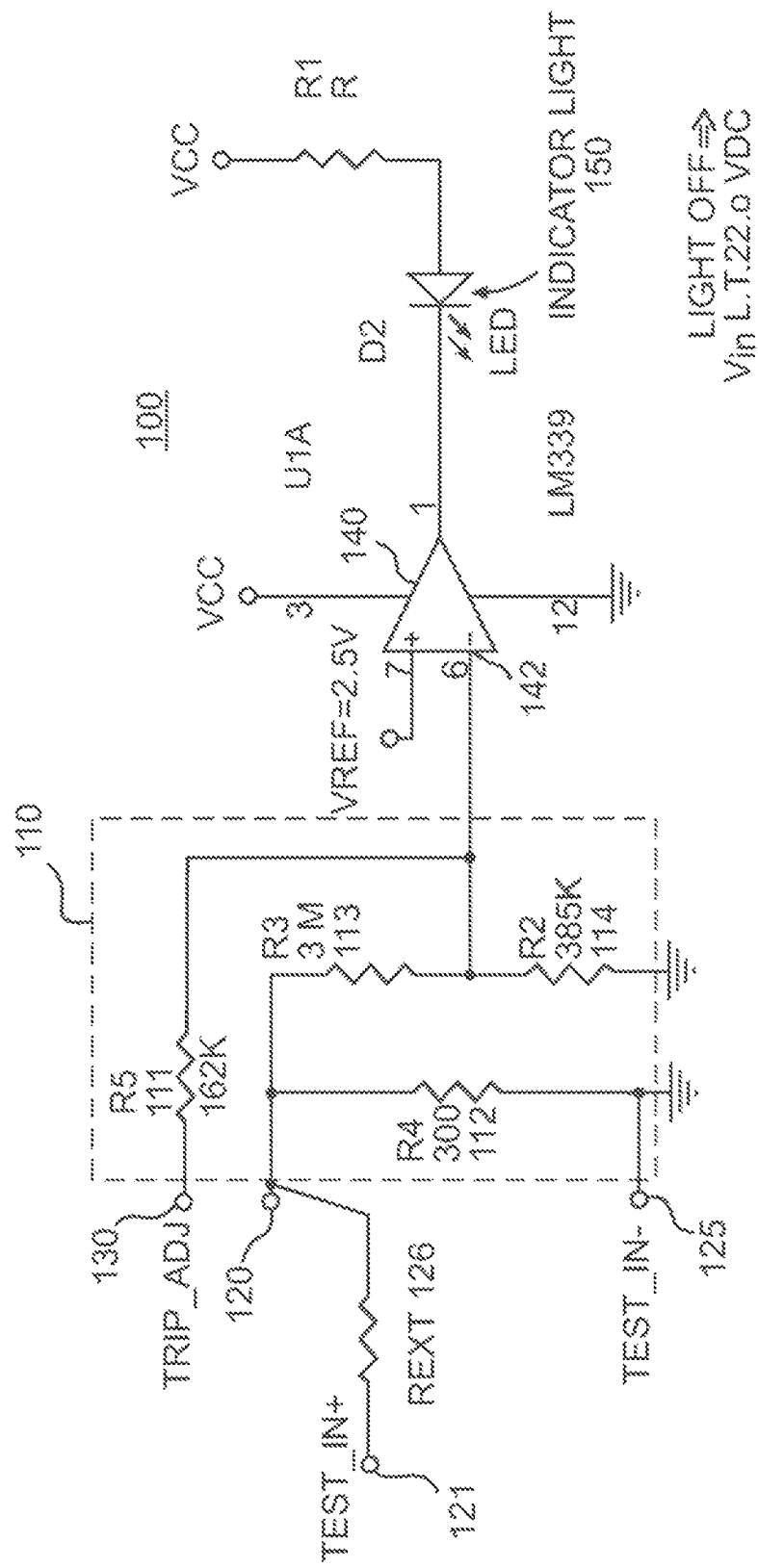
Figure 1C:
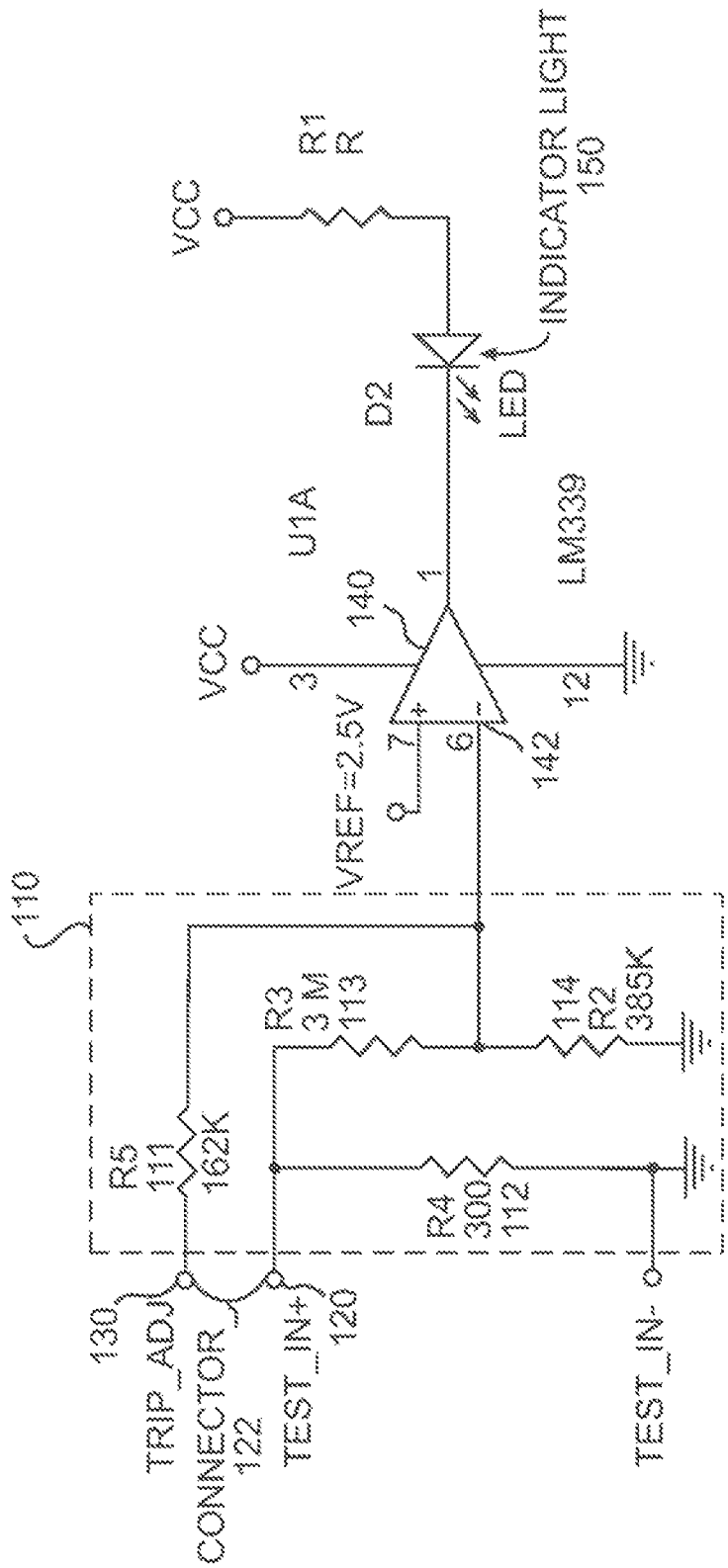
Figure 1D:
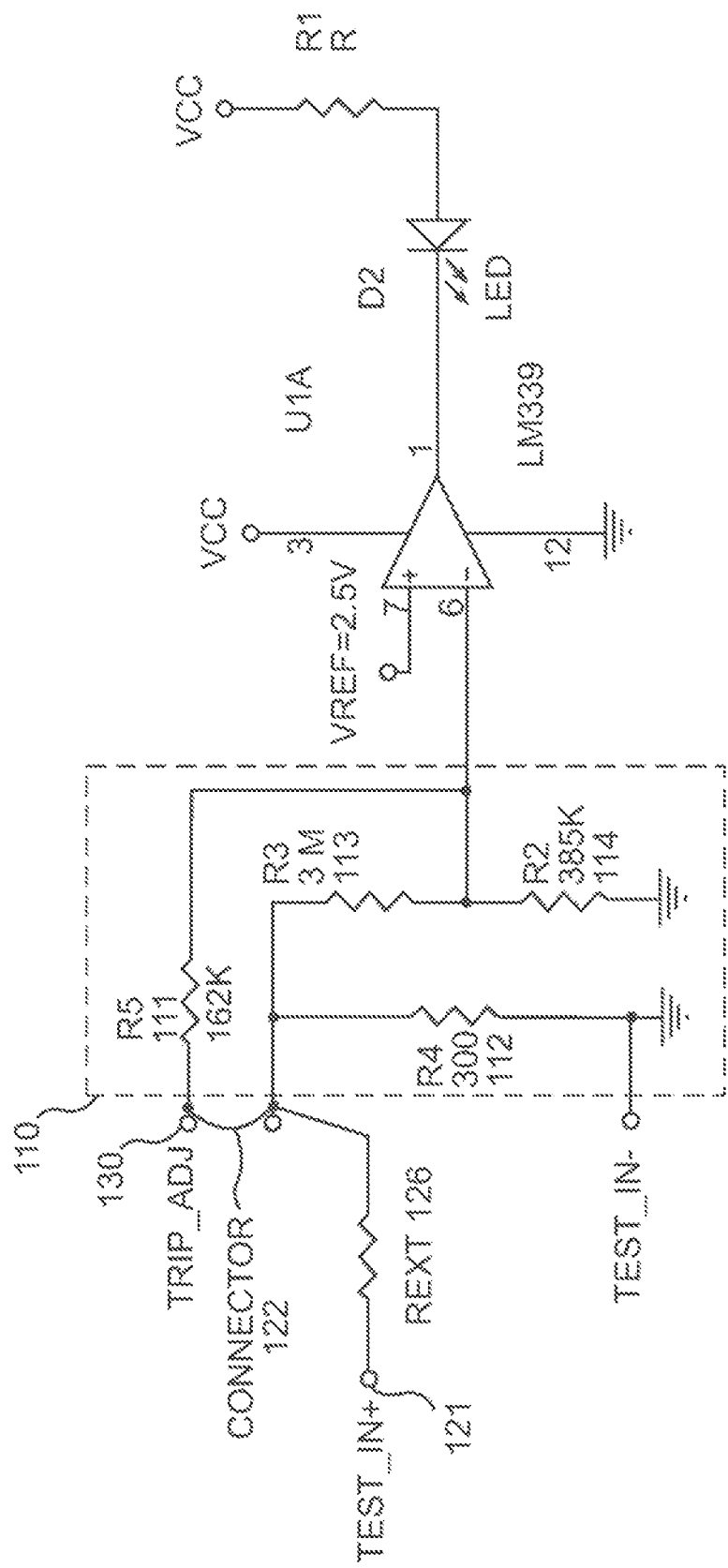
Figure 3A:
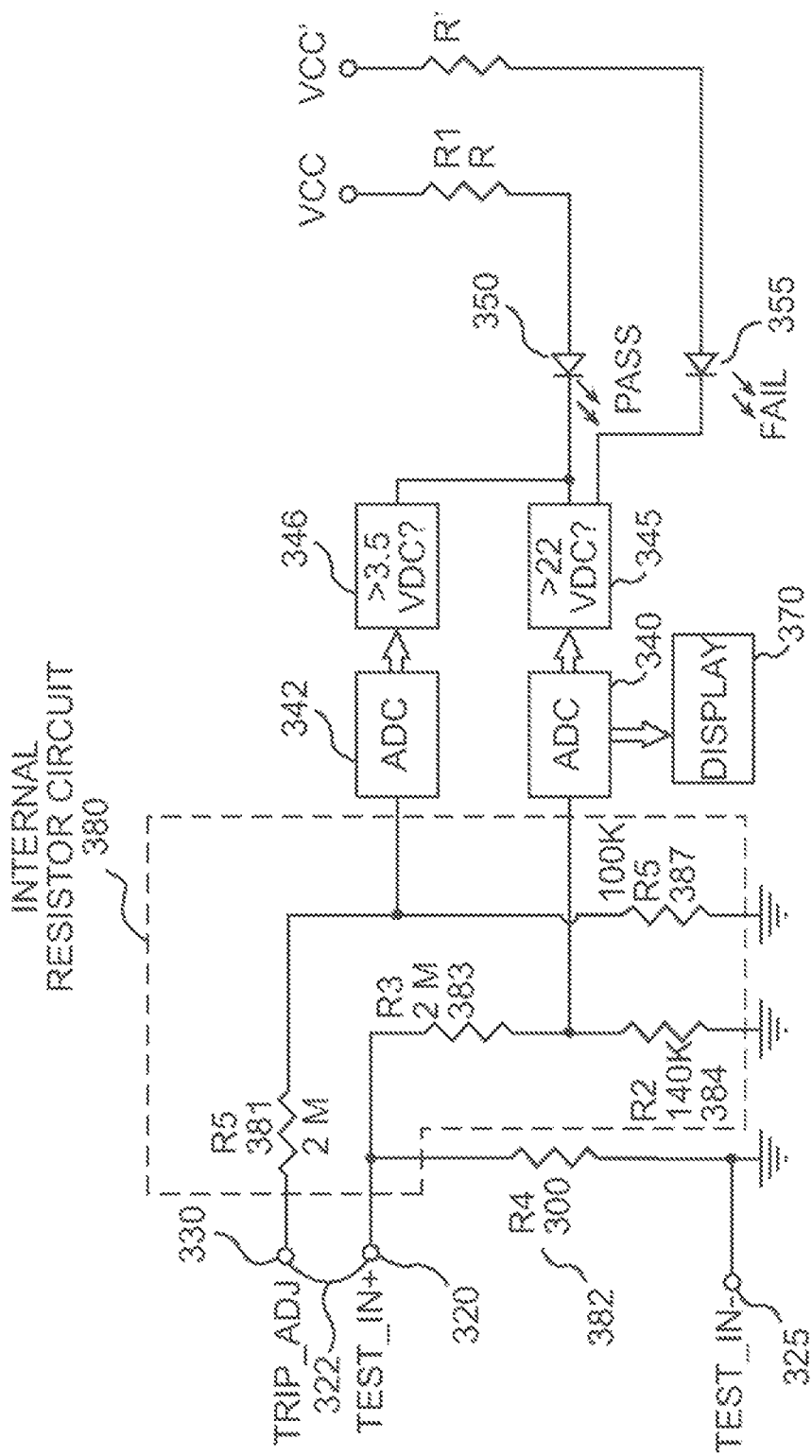
FIGS. 3a-3b illustrate a schematic representation of an exemplary embodiment of a digital voltage detector in accordance with the present invention.
Figure 3B:
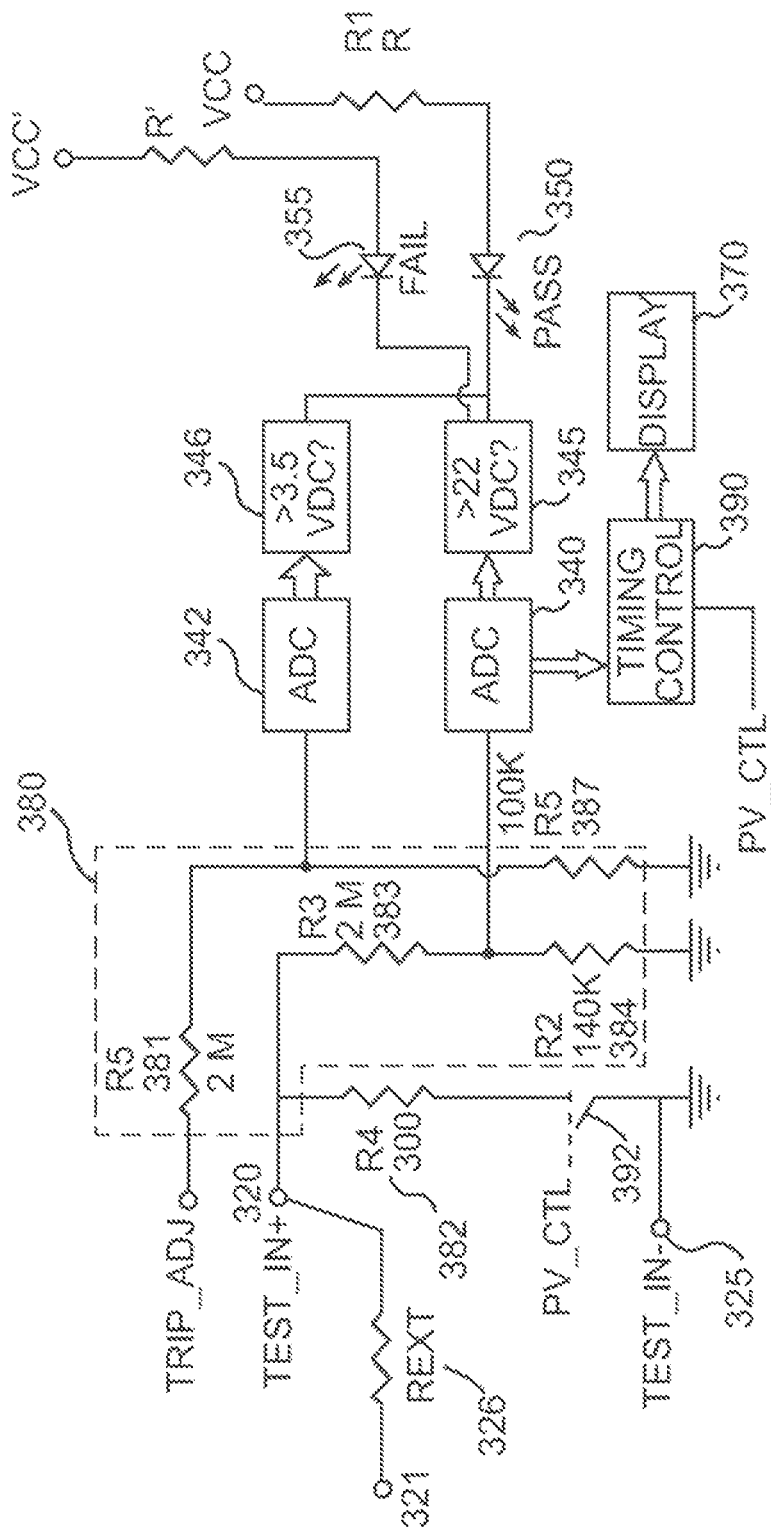

FIGS. 3a-3b illustrate schematic representations of an exemplary embodiments of a digital voltage detector in accordance with the present invention. Turning to FIG. 3a, the case in which the low voltage trip point is lowered to 3.5 VDC by using a connector 322 from the TRIP_ADJ pin 330 to TEST_IN+ 320 is shown. Rather than having the TRIP_ADJ pin 330 change the input impedance to the voltage comparator 140, as shown in FIG. 1c, an additional analog-to-digital converter 342 separately measures the voltage on the TRIP_ADJ pin 330. As shown in FIG. 3a, the voltage at TRIP_ADJ is measured using an analog-to-digital converter 342, which is separate from the analog-to-digital converter 340 used to measure the input voltage, TEST_IN+ 320. In this case, either a 3.5 VDC input at TRIP_ADJ 330 or a 22 VDC input at TEST_IN+ 320 will cause the PASS light 355 to turn on, as dictated by microcontrollers 346 and 345, respectively. Microcontrollers are applicable in accordance with an exemplary embodiment, and any custom digital logic circuit which analyzes the output from the analog-to-digital converter can be used. The digital display 370, however, only shows the voltage input at TEST_IN+ 320.

FIG. 3b shows the additional elements utilized for the case of a raised Presence of Voltage under voltage trip point, wherein, an external resistor 326 is placed in series with TEST_IN+. In addition, to accurately report input voltage, an electronic switch 392 is placed in series with the 300 ohm load resistor 381 on the TEST_IN+ signal 321. Switch 392 maybe a photoMOS relay, but it may also be a MOSFET or other type of switch. Switch 392 is controlled by a Timing Control module 390 in the software of the digital voltage detector in accordance with an exemplary embodiment of the present invention. The Timing Control 390 module closes switch 392, engaging the 300 ohm resistor 382 to determine if the input voltage (TEST_IN+) is greater than the 22 VDC threshold or greater than the 3.5 VDC threshold when connector 322 is in place connecting TRIP_ADJ pin 330. Periodically, the Timing Control Module 390 briefly turns off the 300 ohm resistor 382, opens switch 392 and measures the input voltage at TEST_IN+ 321 when an external resistor 326 and connector 322 are present. The measured and displayed voltage at TEST_IN+ is then the full input voltage without the 300 ohm load impedance 382. The Timing Control 390 directly measures the TEST_IN+ voltage four times per second, measuring the input voltage for 4 ms 410, every 250 ms 420, as shown in the timing diagram in FIG. 4.

In the absence of an external resistor 326 or of a jumper 322, the circuit has a threshold voltage of the nominal 22.0 VDC and the digital display gives a direct reading of the input voltage. When the external resistor 326 is replaced by a wire or short circuit, the periodic opening and closing of the 300 ohm switch 392 will have minimal effect on the voltage measured at the analog-to-digital converter 440, affording a desired accurate display.

The conventional internal resistor circuit 110 includes a load resistor 112 connected from TEST_IN+ 120 to TEST_IN− 125, a resistor 111 in series with TRIP_ADJ 330, a two resistor voltage divider 113, 114 off of TEST_IN+ 120, wherein resistor 111 is in parallel with resistor 113, as shown in FIG. 1.

In contrast, the internal resistor circuit 380, according to an exemplary embodiment of the present invention, includes a load resistor 382 connected from TEST_IN+ 320 to via a switch 392 to TEST_IN− 325. A resistor 381 is in series with TRIP_ADJ 330, while a two resistor voltage divider 383, 384 is off of TEST_IN+ 320, and wherein resistor 381 is in parallel with resistor 383, as shown in FIGS. 3a and 3b. Internal resistor circuit 380 also includes a putt down resistor 387.

The internal resistor circuit of the conventional voltage detector is designed to keep the analog-to-digital converter in the useable range for expected input voltages. In the conventional voltage detector, an input impedance of approximately 3.385 Mega-ohms 113,114 is used for the input sensing circuit 110, as shown in FIG. 1a. The specific resistor values chosen cause the voltage at the negative input 142 of the analog comparator 140 to equal a reference voltage of 2.5 VDC, when 22 VDC is applied to the input circuit. When an external connector 122 is placed between the TEST_IN+ 120 and TRIP_ADJ 130 terminals, a tower impedance 111 of 162 kilo-ohms is added in parallel to the circuit. This causes the voltage at the negative input 142 to reach 2.5 VDC when an input voltage of only 3.5 VDC is applied.

In accordance with an exemplary embodiment of the present invention, the conventional input circuit 110 is replaced by an internal resistance circuit 380 that includes two sets of measurement inputs and two independent analog to digital converters 340, 342. These differences provide improved consistency of input impedance at 2.1 Mega-ohms regardless of the use of the input jumper 322.

Figure 5:
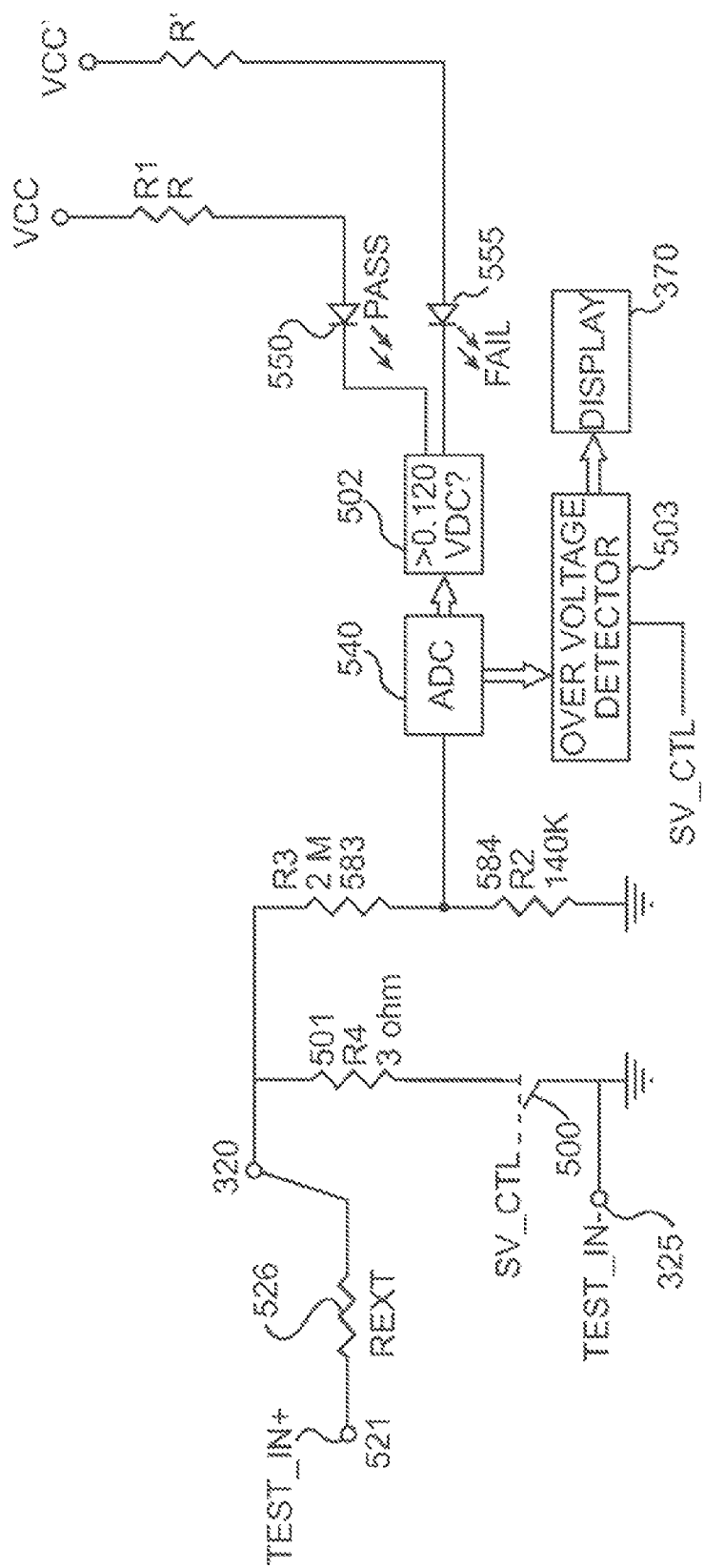
FIG. 5 illustrates a schematic representation of an exemplary embodiment of a digital voltage detector in accordance with the present invention for stray voltage measurements.

Referring to FIG. 5, for the stray voltage test, in accordance with the present invention, another resistor circuit is applied between TEST_IN+ and the analog-to-digital converter. In the stray voltage test configuration, a separate three ohm load resistance 501 is electrically connected to the TEST_IN+ connection, in the absence of the 300 ohm load resistance employed in the presence of voltage tests. The control logic for the stray voltage test includes a voltage threshold criteria 502 that is set for voltages greater than 0.120 VDC or less than −0.120 VDC. The control logic also includes an overvoltage detector 503 that removes the three ohm load resistor 501 from the input circuit via an electronic switch 500. The switch may be a MOSFET relay or an electromechanical relay. Quickly removing the three ohm resistor 501 prevents damage to the resistor and prevents fuses from being blown in the digital voltage detector, in accordance with the present invention.

While specific alternatives to steps of the invention have been described herein, additional alternatives not specifically disclosed but known in the art are intended to fall within the scope of the invention. Thus, it is understood that other applications of the present invention will be apparent to those skilled in the art upon reading the described embodiment and after consideration of the appended claims and drawing.

What is claimed is:

1. A method of measuring a Presence of Voltage in an Armament Circuits Preload Test Series, the method comprising:

using a digital voltage detector system;
   using a first digital converter with a respective microcontroller connected to a test input connection via a first branch of an internal resistor circuit, and using a second analog to digital converter with a second respective microcontroller connected to the test-adjustment lead via a second branch of the internal resistor circuit;
   measuring a Presence of Voltage in an Armament Circuits Preload Test Series; and
   displaying the measured voltage on a digital display.

2. The method according to claim 1, further comprising:
lowering an under voltage trip point to a first voltage below a normal low voltage value by connecting a test-adjustment pin to a test input connection.

3. The method according the claim 2, further comprising:
lowering an under voltage trip point to a second voltage, which is greater than the first voltage and less than the normal voltage value, by connecting the test-adjustment pin to a test input connection and connecting an external resistor in series to the test input connection.

4. The method according to claim 1, further comprising:
raising an under voltage trip point to a first voltage which is greater than the normal low voltage value by connecting an external resistor to a test input connection.

5. A method of measuring a Stray Voltage in an Armament Circuits Preload Test Series, the method comprising:
using a digital voltage detector system;
a first digital converter with a respective microcontroller connected to a test input connection via a first branch of an internal resistor circuit, and using a second analog to digital converter with a second respective microcontroller connected to the test-adjustment lead via a second branch of the internal resistor circuit;
measuring a Stray Voltage in an Armament Circuits Preload Test Series; and
displaying the measured voltage on a digital display.

6. The method according to claim 5, further comprising:
using a digital voltage detector system;
using a low ohm load resistor connected to a positive test input connection;
measuring a voltage at the positive test input connection;
comparing an absolute value of a measured voltage to nominal threshold voltage; and
rendering a pass signal if the absolute value of the measured voltage is less than the nominal threshold voltage.

7. The method according to claim 6, wherein:
using a digital voltage detector system; and
quickly disconnecting the low ohm resistor via a switch controlled by an over-voltage detector when a measure voltage exceeds an upper voltage limit.

* * * * *